(12) United States Patent
Nardi et al.

(10) Patent No.: US 9,047,940 B2
(45) Date of Patent: Jun. 2, 2015

(54) RESISTIVE RANDOM ACCESS MEMORY CELLS HAVING VARIABLE SWITCHING CHARACTERISTICS

(71) Applicants: Intermolecular Inc., San Jose, CA (US); Kabushiki Kaisha Toshiba, Tokyo (JP); SanDisk 3D LLC, Milpitas, CA (US)

(72) Inventors: Federico Nardi, Palo Alto, CA (US); Yun Wang, San Jose, CA (US)

(73) Assignees: Intermolecular, Inc., San Jose, CA (US); Kabushiki Kaisha Toshiba, Tokyo (JP); SanDisk 3D LLC, Milpitas, CA (US)

( * ) Notice: Subject to any disclaimer, the term of this patent is extended or adjusted under 35 U.S.C. 154(b) by 11 days.

(21) Appl. No.: 13/738,524

(22) Filed: Jan. 10, 2013

(65) Prior Publication Data

US 2014/0192586 A1    Jul. 10, 2014

(51) Int. Cl.
*G11C 11/00*    (2006.01)
*G11C 13/00*    (2006.01)
(Continued)

(52) U.S. Cl.
CPC ............ *G11C 13/0007* (2013.01); *H01L 45/06* (2013.01); *H01L 45/08* (2013.01); *H01L 45/085* (2013.01); *H01L 45/1233* (2013.01); *H01L 45/145* (2013.01); *H01L 45/146* (2013.01); *H01L 45/147* (2013.01); *H01L 45/149* (2013.01); *H01L 27/2463* (2013.01); *H01L 27/2481* (2013.01); *G11C 13/0069* (2013.01);
(Continued)

(58) Field of Classification Search
CPC ........... G11C 13/0004; G11C 11/5678; G11C 2213/56

USPC ................................................... 365/148, 158
See application file for complete search history.

(56) References Cited

U.S. PATENT DOCUMENTS 3,883,887 A    5/1975    Robinson, Sr.
5,383,088 A    1/1995    Chapple-Sokol et al.
(Continued)

FOREIGN PATENT DOCUMENTS

WO    WO-2007-004843 A1    1/2007

OTHER PUBLICATIONS

Kim et al; Anodeinterface localized filamentary mechanism in resistive switching of TiO2 thin films; Jul. 6, 2007; American Institute of Physics; Applied Physics Letters Jul. 6, 2007 pp. 01290710129073 vol. 91.

(Continued)

*Primary Examiner* — Anthan Tran

(57) ABSTRACT

Provided are resistive random access memory (ReRAM) cells forming arrays and methods of operating such cells and arrays. The ReRAM cells of the same array may have the same structure, such as have the same bottom electrodes, top electrodes, and resistive switching layers. Yet, these cells may be operated in a different manner. For example, some ReRAM cells may be restively switched using lower switching voltages than other cells. The cells may also have different data retention characteristics. These differences may be achieved by using different forming operations for different cells or, more specifically, flowing forming currents in different directions for different cells. The resulting conductive paths formed within the resistive switching layers are believed to switch at or near different electrode interfaces, i.e., within a so called switching zone. In some embodiments, a switching zone of a ReRAM cell may be changed even after the initial formation.

14 Claims, 9 Drawing Sheets

(51) Int. Cl.
*H01L 45/00* (2006.01)
*H01L 27/24* (2006.01)

(52) U.S. Cl.
CPC .... *G11C 2013/0083* (2013.01); *G11C 2213/12* (2013.01); *G11C 2213/15* (2013.01); *G11C 2213/52* (2013.01); *G11C 2213/71* (2013.01)

(56) References Cited

U.S. PATENT DOCUMENTS

| | | | |
|---|---|---|---|
| 5,810,923 | A | 9/1998 | Yano |
| 7,067,862 | B2 | 6/2006 | Rinerson et al. |
| 7,157,783 | B2 | 1/2007 | Marsh |
| 7,535,035 | B2 | 5/2009 | Baek |
| 7,666,526 | B2 | 2/2010 | Chen et al. |
| 7,777,215 | B2 | 8/2010 | Chien et al. |
| 7,816,659 | B2 | 10/2010 | Herner |
| 7,897,453 | B2 | 3/2011 | Chen |
| 7,960,224 | B2 | 6/2011 | Chien |
| 8,116,116 | B2 | 2/2012 | Hwang |
| 8,288,297 | B1 | 10/2012 | Wang |
| 8,354,660 | B2 | 1/2013 | Sekar |
| 2004/0159828 | A1 | 8/2004 | Rinerson |
| 2006/0171200 | A1 | 8/2006 | Rinerson et al. |
| 2006/0263289 | A1 | 11/2006 | Heo et al. |
| 2008/0200003 | A1 | 8/2008 | Hong |
| 2010/0110764 | A1* | 5/2010 | Sun et al. ............... 365/148 |
| 2011/0122680 | A1* | 5/2011 | Ikeda et al. ............. 365/148 |
| 2011/0175050 | A1 | 7/2011 | Chien et al. |
| 2011/0227020 | A1 | 9/2011 | Sekar |
| 2012/0039109 | A1* | 2/2012 | Srinivasan et al. ........ 365/148 |
| 2012/0044751 | A1* | 2/2012 | Wang et al. ............ 365/148 |

OTHER PUBLICATIONS

Lee et al.; Resistance Switching Behaviors of Hafnium Oxide Films Grown by MOCVD for Nonvolatile Memory Applications; Dec. 6, 2007; Pohang Institute of Science and Technology. Korea; Journal of the Electrochemical Society Dec. 6, 2007 pp. H92H96 vol. 155 2.
Smyth; The defect chemistry or metal oxides; Jan. 1, 2000; Chapters 15 8 9 and 12 pp. 174 118161 and 217237.
Yang et al.; Memristive switching mechanism for metaloxidemetal nanodevices; Jun. 15, 2008; Macmillan Publishers Limited; Nature Nanotechnology pp. 429433 vol. 3 Jul. 2008.
Sanchez, Mj., et al.; A Mechanism for Unipolar Resistance Switching in Oxide Nonvolatile Memory Devices; Jan. 1, 2007; Universidad De Buenes Aires; Applied Physics Letters 912521012007 American Institute of Physics.
Beck, A., et al.; Reproducible Switching Effect in Thin Oxide Films for Memory Applications; Jul. 3, 2000; IBM—International Business Machines Corporation; Applied Physics Letters vol. 77 No. 1 pp. 139141.
Baek, I.G., et al.; MultiLayer CrossPoint Binary Oxide Resistive Memory OxRRAM for PoastNAND Storage Application; Jan. 1, 2005; Samsung Electronics Co., Ltd.
Seo, S., et al.; Resistance Switching Mechanism of MetalOxideMetal Structure NiO; ; Samsung Electronics Co., Ltd.; Presentation of Samsung undated.
Wang, Y., et al.; Characterization of UltraThin Hafnium Oxide Films Grown on Silicon by Atomic Layer Deposition Using Tetrakisethylmethylamino Hafnium and Water Precursors; Jan. 1, 2007; Sematech; Chem. Mater. pp. 31273138.
Kim, K, et al.; Atomic Layer Deposition of Insulating Nitride Interfacial Layers for Germanium Metal Oxide Semiconductor Field Effect Transistors with Highk OxideTungsten Nitride Gate Stacks; May 21, 2007; Harvard, College (US) ; Applied Physics Letters pp. 9092.
Choi, K., et al.; Initial Growth of Interfacial Oxide During Deposition of HfO2 on Silicon; Jul. 12, 2004; Texas Tech University; Applied Physics Letters vol. 85 No. 2 pp. 215218.
Netzer, F.; Interfacial Oxide Layers at the MetalOxide Phase Boundary; Jan. 1, 2002; World Scientific Publishing Company; Surface Review and Letters vol. 9 Nos. 3 and 4 pp. 15531563.
Fillot, F., et al.; Investigations of the Interface Stability in HfO2Metal Electrodes; Jan. 1, 2003; STM-AMAT; Microelectronic Engineering pp. 384391.
FormingFree Nitrogen Doped AlOX RRAM with SubA Programming Current; Jan. 1, 2011; Department of Electrical Engineering, Stanford University, Stanford; Symposium on VLSI Technology Digest of Technical Papers.
Wang, X., et al.; Effect of Anodic Interface Layers on the Unipolar Switching of HfO2based Resistive RAM; Jan. 1, 2010.

* cited by examiner

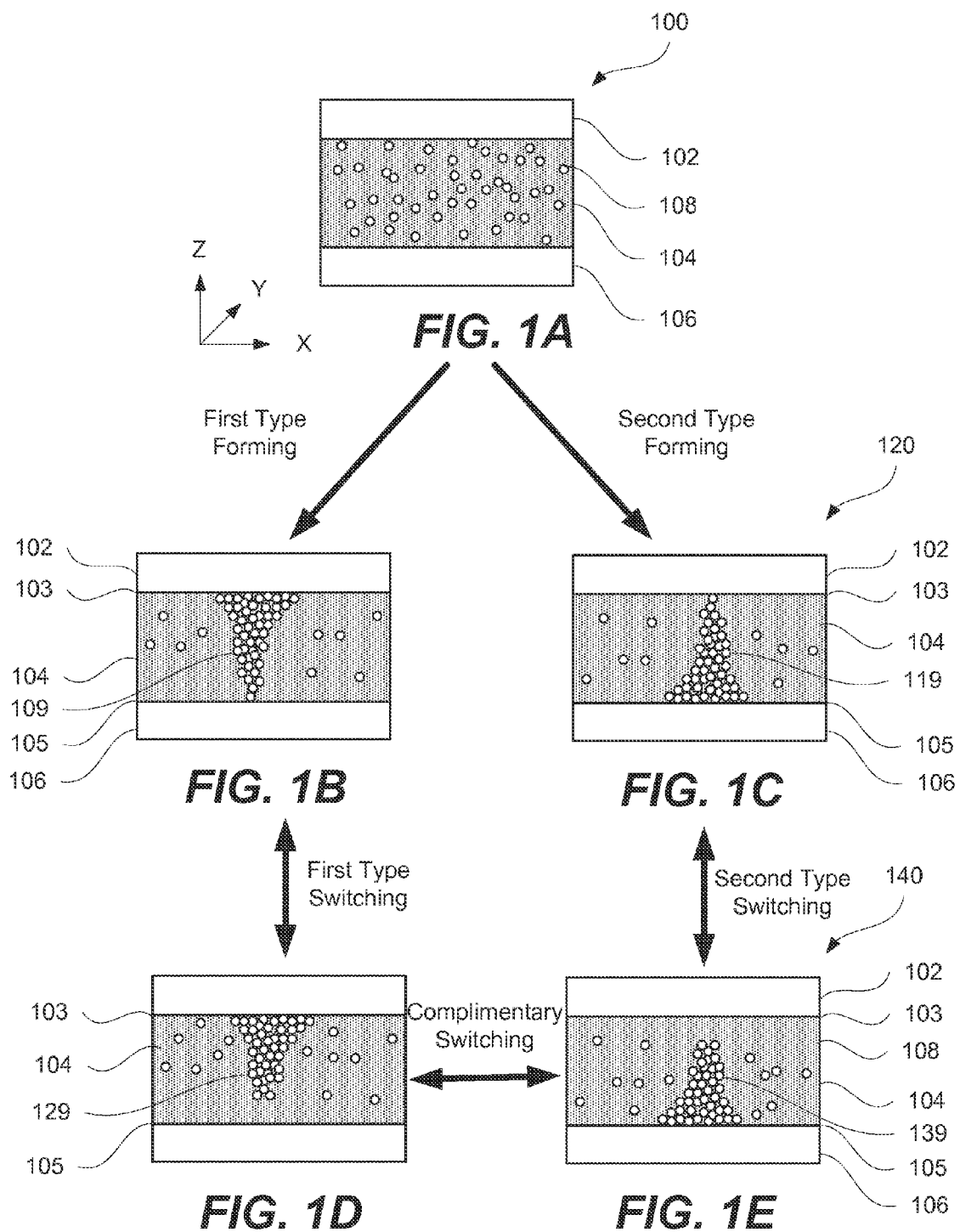

First Type Switching

Complementary Switching

Complementary Switching

Second Type Switching

RESISTIVE RANDOM ACCESS MEMORY CELLS HAVING VARIABLE SWITCHING CHARACTERISTICS

BACKGROUND

Nonvolatile memory is computer memory capable of retaining the stored information even when unpowered. Nonvolatile memory may be used for secondary storage or long-term persistent storage, for example, in addition to volatile memory. Nonvolatile memory can be permanently integrated into computer systems (e.g., solid state hard drives) or it can take the form of removable and easily transportable memory cards (e.g., universal serial bus flash drives). Nonvolatile memory is becoming more popular because of its small size and high density, low power consumption, fast read rates and write rates, data retention, and other characteristics.

Flash memory is a common type of nonvolatile memory because of its high density and low fabrication costs. Flash memory is a transistor-based memory device that uses multiple gates per transistor and quantum tunneling for storing the information on its memory device. Flash memory uses a block-access architecture that can result in long access, erase, and write times. Flash memory also suffers from low endurance and scaling limitations.

The constantly increasing speed of electronic devices and storage demand drive new requirements for nonvolatile memory. For example, nonvolatile memory is expected to replace hard drives in many new computer systems. However, transistor-based flash memory is often inadequate to meet the requirements for nonvolatile memory. New types of memory are being developed to meet these demands and requirements.

SUMMARY

Provided are resistive random access memory (ReRAM) cells forming arrays and methods of operating such cells and arrays. The ReRAM cells of the same array may have the same structure, such as have the same bottom electrodes, top electrodes, and resistive switching layers. Yet, these cells may be operated in a different manner. For example, some ReRAM cells may be restively switched using lower switching voltages than other cells. The cells may also have different data retention characteristics. These differences may be achieved by using different forming operations for different cells or, more specifically, flowing forming currents in different directions for different cells. The resulting conductive paths formed within the resistive switching layers are believed to switch at or near different electrode interfaces, i.e., within a so called switching zone. In some embodiments, a switching zone of a ReRAM cell may be changed even after the initial formation.

In some embodiments, a method involves providing a first ReRAM cell and a second ReRAM cell. Each ReRAM cell includes a top electrode, a bottom electrode, and a resistive switching layer disposed between the top electrode and the bottom electrode. The top electrodes of both ReRAM cells have the same composition, the bottom electrodes of both ReRAM cells have the same composition, and the resistive switching layer of both ReRAM cells have the same composition. However, the top electrodes of these cells have different composition than the bottom electrodes.

The method continues with forming an initial conductive path through the resistive switching layer of the first ReRAM cell. This forming operation involves passing an electrical current in a direction from the top electrode to the bottom electrode of the first ReRAM cell. The method also involves forming an initial conductive path through the resistive switching layer of the second ReRAM cell. This other forming operation involves passing a current in a direction from the bottom electrode to the top electrode of the second ReRAM cell. In other words, the first ReRAM cell and the second ReRAM cell are formed in a different manner or, more specifically, by passing the electrical currents in different directions. The resistances of the resistive switching layers having the initially formed conductive paths of the first ReRAM cell and the second ReRAM cell may be different. For example, the resistance of the resistive switching layer having the initially formed conductive path of the first ReRAM cell may be less than a half of the resistance of the resistive switching layer having the initially formed conductive path of the second ReRAM cell.

In some embodiments, the method proceeds with breaking the initially formed conductive path through the resistive switching layer of the first ReRAM cell. This breaking operation involves passing an electrical current in a direction from the bottom electrode to the top electrode of the first ReRAM cell. Furthermore, the method may involve breaking the initially formed conductive path through the resistive switching layer of the second ReRAM cell. This other breaking operation involves passing an electrical current in a direction from the bottom electrode to the top electrode of the second ReRAM cell. In some embodiments, the total power used for breaking the initially formed conductive path through the resistive switching layer of the first ReRAM cell is different from the total power used for breaking the initially formed conductive path through the resistive switching layer of the second ReRAM cell. For example, the total power used for breaking the initially formed conductive path through the resistive switching layer of the first ReRAM cell is less than a half of the total power used for breaking the initially formed conductive path through the resistive switching layer of the second ReRAM cell.

In some embodiments, the method also involves setting a new conductive path through the resistive switching layer of the first ReRAM cell. The setting operation involves passing an electrical current in a direction from the top electrode to the bottom electrode of the first ReRAM cell. The method may also involve setting a new conductive path through the resistive switching layer of the second ReRAM cell. This setting operation comprises passing a current in a direction from the bottom electrode to the top electrode of the second ReRAM cell. In some embodiments, the total power used for setting the new conductive path through the resistive switching layer of the first ReRAM cell is different from the total power used for setting the new conductive path through the resistive switching layer of the second ReRAM cell. For example, the total power used for setting the new conductive path through the resistive switching layer of the first ReRAM cell is less than a half of the total power used for setting the new conductive path through the resistive switching layer of the second ReRAM cell.

In some embodiments, after setting the new conductive path through the resistive switching layer of the first ReRAM cell, the method involves forming a modified conductive path through the resistive switching layer of the first ReRAM cell. This forming operation comprises passing an electrical current in a direction from the bottom electrode to the top electrode of the first ReRAM cell.

In some embodiments, after forming the modified conductive path through the resistive switching layer of the first ReRAM, the method involves breaking the modified conductive path through the resistive switching layer of the first ReRAM cell. This breaking operation involves passing an electrical current in a direction from the top electrode to the bottom electrode of the first ReRAM cell.

In some embodiments, after breaking the modified conductive path through the resistive switching layer of the first ReRAM, the method also involves setting a new modified conductive path through the resistive switching layer of the first ReRAM cell. This setting operation involves passing an electrical current in a direction from the bottom electrode to the top electrode of the first ReRAM cell. In some embodiments, the resistance of the resistive switching layer of the first ReRAM cell after setting the new modified conductive path in the resistive switching layer of the first ReRAM cell is equal to a resistance of the resistive switching layer of the second ReRAM cell after forming the new conductive path through the resistive switching layer of the second ReRAM cell.

In some embodiments, the top electrodes of the first and second ReRAM cells include titanium nitride, while the bottom electrodes of the first and second ReRAM cells include doped polysilicon. Specifically, the bottom electrodes of the first and second ReRAM cells may include n-doped polysilicon. The resistive switching layers of the first and second ReRAM cells may include hafnium oxide.

In some embodiments, the resistive switching layer of each ReRAM cell has a first composition at its interface with the top electrode and a second composition at its interface with the second electrode. The first composition may be different from the second composition. For example, the resistive switching layer of each ReRAM cell may be a bi-layer. The bi-layer includes two sub-layers having different compositions.

Provided also is ReRAM device including a first ReRAM cell and a second ReRAM cell. Each ReRAM cell includes a top electrode, a bottom electrode, and a resistive switching layer disposed between the top electrode and the bottom electrode. The top electrodes of both ReRAM cells have same composition, the bottom electrodes of both ReRAM cells have the same composition, and the resistive switching layer of both ReRAM cells have the same composition. However, the top electrodes have different composition than the bottom electrodes. In the first ReRAM cell, a conductive path of the resistive switching layer tapers towards the top electrode, while in the second ReRAM cell, a conductive path of the resistive switching layer tapers towards the bottom electrode.

BRIEF DESCRIPTION OF THE DRAWINGS

To facilitate understanding, the same reference numerals have been used, where possible, to designate common components presented in the figures. The drawings are not to scale and the relative dimensions of various elements in the drawings are depicted schematically and not necessarily to scale. Various embodiments can readily be understood by considering the following detailed description in conjunction with the accompanying drawings, in which:

FIG. 1A illustrates a schematic representation of a ReRAM cell prior to initial forming operation, in accordance with some embodiments.

FIGS. 1B and 1D illustrate schematic representations of the same ReRAM cell in its low resistive state and high resistive state being switched at the bottom electrode interface, in accordance with some embodiments.

FIGS. 1C and 1E illustrate schematic representations of the same ReRAM cell in its low resistive state and high resistive state being switched at the top electrode interface, in accordance with some embodiments.

DETAILED DESCRIPTION

Figure 2A:
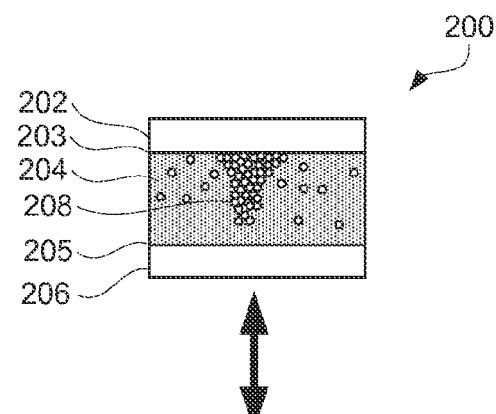
FIGS. 2A-2E illustrate schematic representations of a ReRAM cell during its two types of operational switching and complementary switching, in accordance with some embodiments.

A detailed description of various embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

Introduction

A ReRAM cell exhibiting resistive switching characteristics generally includes multiple layers formed into a stack. The structure of this stack is sometimes described as a Metal-Insulator-Metal (MIM). Specifically, the stack includes two conductive layers operating as electrodes. These layers are identified as "M" and may include metals and/or other conductive materials. The stack also includes an insulator layer disposed in between the electrode. This layer is identified as "I" in the above naming convention. The insulator layer exhibits resistive changing properties characterized by different resistive states of the material forming this layer. As such, this insulator layer is often referred to as a resistive switching layer. These resistive states may be used to represent one or more bits of information.

During operational switching used to change the stored data, the resistive switching layer changes its resistive state when a certain switching voltage (e.g., a set voltage or a reset voltage) is applied to this layer and generates a switching current through the layer. This electrical current causes heating within the layer and/or at one of both of its interfaces with other components, such as the electrodes. Without being restricted to any particular theory, it is believed that a combination of the electrical field and heating (created by the applied voltage and the resulting current) causes formation and breakage of various conductive paths within the resistive switching layer and/or at its interfaces. It is also believed that these conductive paths are established and broken by moving defects (e.g., oxygen vacancies) within the resistive switching layer and through one or more interfaces that the resistive switching layer forms with adjacent layers, such as the electrodes.

When different components of a ReRAM cell is initially deposited forming a stack that includes a resistive switching layer, the defects in the resistive switching layer may be randomly distributed and may not form any conductive paths. The initial formation of a conductive path is referred to as a forming operation. It requires substantial amount of power to move the defects within a large part of the resistive switching layer and arrange these defects into one or more initial conductive paths. Once the initial conductive path is formed, it needs to be broken only partially in order to detectably change the resistance of the resistive switching layer needed to store the data. This operation is referred to as a reset operation and corresponds to switching from a low resistive state (in which a conductive path extends through the entire thickness of the resistive layer) to a high resistive state (in which a conductive path is at least partially broken). For example, a portion of the conductive path at one interface may be broken and defects that formed these portions may be redistributed within the resistive switching layer, such as moved away from the interface. The rest of the conductive path may remain substantially intact. Without being restricted to any particular theory, it is believed that a conductive path is usually broken at or near the interface of the resistive switching layer with one of the electrodes. Upon applying the reset current, the defects are shifted away from this interface.

When the resistive switching layer is switched back to its low resistive state, a conductive path is rebuilt. This operation is referred to as a set operation and corresponds to switching from a high resistive state (in which a conductive path is at least partially broken) to a low resistive state (in which a conductive path again extends through the entire thickness of the resistive layer). It should be noted that during the set operation only the missing portion of the conductive path needs to be reestablished as opposed to the forming operation during which the entire conductive path needs to be formed. As such, the power required for the set operation is generally substantially less than the power required for the forming operation. The set and reset operations are parts of operational switching, which should be distinguished from initial forming operations and complementary switching.

Without being restricted to any particular theory, it is believed that an initial formed conductive path has a tapered shape with a narrow neck portion interfacing one electrode and a wide base portion interfacing the other electrode. This tapering effect is believed to be a result of the current flow direction (i.e., the polarity of the voltage applied to the resistive switching layer) during forming operation and the electrical charge of the defects as well as the current level. For example, application of the current is precisely controlled to prevent the forming operation going beyond the desired threshold, which may be set based on changes in the resistance of the cell. When the conductive path is broken during the reset operation, it is believed to be broken at the narrow neck portion. The defects forming this neck portion are carried by the electrical current away from the electrode interface and towards the other electrode interface thereby breaking the path and disconnecting the two electrodes. When a reverse current is flown during the set operation that carries the defects back and the narrow neck is rebuilt. This is sometimes referred to as a bipolar switching because the polarities of the set and reset operations are different.

The switching characteristics, such as voltage or, more generally, power used for set and reset operations, data retention corresponding to stability of the resistive states, switching speed and endurance, depend on the initially formed conductive path and, in particular, on the interface formed by the resistive switching layer and the electrode to which the narrow neck portion extends to. The narrow neck portion responsible for switching may be referred to as a switching zone. The remaining portion of the conductive path, i.e., the wide base portion, is believed to be less critical for the operational switching. As such, the switching zone is typically located near or at one of the interfaces of the resistive switching layer and may be referred to as a switching interface.

In conventional memory arrays, the same type of ReRAM cells are used within an array and switched in the same manner. For example, the ReRAM cells may have the same types of top electrodes, bottom electrodes, and resistive switching layers. All these ReRAM cells are subjecting to the same forming operation, in which the current flows in the same direction, i.e., either from the top electrodes to the bottom electrodes or from the bottom electrodes to the top electrodes. As such, all the cells have the same orientation of the switching zone, i.e., all being either near the top electrodes or near the bottom electrodes. In fact, the ReRAM cells are conventionally designed to have only one predetermined location of the switching zone. Since the location of the switching zone determines the switching characteristics, all cells in the same memory array conventionally have the same characteristics.

As such, when different types of memories are needed on the same device, multiple conventional memory arrays are provided on the device. This approach is ineffective. Furthermore, if memory requirements change later, the initially provided memory arrays may need to be physically replaced by another type of memory. For example, a computer system may be initially designed to have less memory capable of fast low power switching and more memory capable of long data retention. Such a system may be used for large file storage and data back-up. Because of this configuration, this system may not be suitable for fast processing and other uses that demand fast low power memory. Either the system needs to be modified or replaced.

Provided are ReRAM cells forming an array, in which location of the switching zone of each cell may be independently chosen by controlling the formation operation of the cell. Some cells may be formed with one location of the switching zone (e.g., near the bottom electrode) while other cells may be formed with the other location of the switching zone (e.g., near the top electrode). Even though before the forming operation, all ReRAM cells of the same array may have the same structure of the corresponding components, such as bottom electrodes, top electrodes, and resistive switching layers, performing formation operations in a different manner result yields formed ReRAM cells having different switching characteristics. For example, some ReRAM cells may be restively switched between using a lower power than other cells. The cells may also have different data retention characteristics. Specifically, some cells may be formed by passing an electrical current from their top electrodes to their bottom electrodes, while other cells may be formed by passing an electrical current from their bottom electrodes to the bottom electrodes.

The bottom electrodes, top electrodes, and resistive switching layers are specifically configured to allow forming switching zones either near the bottom electrodes or near the top electrodes. Location of the switching zone may be chosen at any point prior to start of the formation operation. In other words, the same type of cells may be formed with switching zones near the bottom electrodes or with switching zones near the top electrodes. In some embodiments, once the location of the switching zone is established during the initial forming operation, it remains as such during the entire operating lifetime of the cell. Alternatively, the location of the switching zone may be initially formed near one electrode and then changed, i.e., moved next to the other electrode. For example, the same cell may be initially formed as a low power switching cell and then changed into a long data retention cell by changing the location of the switching zones.

While various examples described herein refer to one conductive path extending through a resistive switching layer, one having ordinary skills in the art would understand that a resistive switching layer may have any number of conductive paths extending between its interfaces with the electrodes.

Examples of Nonvolatile ReRAM Cells and their Switching Mechanisms

A brief description of ReRAM cells is provided for context and better understanding of various switching characteristics. As noted above, a ReRAM cell includes a dielectric material exhibiting resistive switching characteristics, i.e., a resistive switching layer. The resistive switching layer, which is initially insulating, can be made more conductive by forming one or more conductive paths through the layer during the forming operation. This operation involves application of a voltage to the layer and generating an electrical current through the layer. Once one or more conductive paths are formed in the dielectric component of a memory device, these conductive paths may be reset (or broken resulting in a high resistance) or set (or re-formed resulting in a lower resistance) by applying certain voltages. Without being restricted to any particular theory, it is believed that resistive switching corresponds to migration of defects within the resistive switching layer and, in some embodiments, across one interface formed by the resistive switching voltage, when a switching voltage is applied to the layer.

FIG. 1A illustrates a schematic representation of ReRAM cell 100 including top electrode 102, bottom electrode 106, and resistive switching layer 104 disposed in between top electrode 102 and bottom electrode 106. It should be noted that the "top" and "bottom" references for electrodes 102 and 106 are used solely for differentiation and do not imply any particular spatial orientation of these electrodes. Often other references, such as "first deposited" and "second deposited" electrodes or simply "first" and "second" electrodes, may be also used to identify and differentiate the two electrodes. ReRAM cell 100 may also include other components, such as an embedded resistor, diode, diffusion barrier layer, and other components. ReRAM cell 100 is sometimes referred to as a memory element or a memory unit.

Top electrode 102 and bottom electrode 106 may be used as conductive lines within a memory array. As such, electrode 102 and 106 may be formed from conductive materials. Resistive switching layer 104 which may be initially formed from a dielectric material and later can be made to conduct through one or more conductive paths formed. To provide this resistive switching functionality, resistive switching layer 104 may include electrically active defects 108. Defects may be introduced into layer 104 during and/or after its deposition. For example, some atoms may be absent from their native structures (i.e., creating vacancy defects) and/or additional atoms may be inserted into the native structures (i.e., creating interstitial defects). Charge carriers may be also using doping, lattice stressing, and other techniques.

In some embodiments, ReRAM cells may operate according to a valence change mechanism, which may occur in specific transition metal oxides, nitrides, and oxy-nitrides. For example, defects may be oxygen vacancies triggered by migration of oxygen anions. Migration of oxygen anions corresponds to the motion of corresponding oxygen vacancies that are used to create and break conductive paths. A subsequent change of the stoichiometry in the transition metal oxides leads to a redox reaction expressed by a valence change of the cation sublattice and a change in the electrical conductivity. In this example, the polarity of the pulse used to perform this change determines the direction of the change, i.e., reduction or oxidation. Other resistive switching mechanisms include bipolar electrochemical metallization mechanisms and thermochemical mechanisms, which lead to a change of the stoichiometry due to a current-induced increase of the temperature. Some of these mechanisms will be further described below with reference to FIGS. 1A-1E.

Specifically, FIG. 1A is a schematic representation of ReRAM cell 100 prior to initial formation of conductive paths, in accordance with some embodiments. In other words, at this stage, all components of ReRAM cell are deposited but the formation operation is not yet performed. Resistive switching layer 104 may include some defects 108. Additional defects 108 may be provided in top electrode 102 and/or bottom electrode 106 and may be later transferred to resistive switching layer 104 during the formation operation. In some embodiments, resistive switching layer 104 has substantially no defects prior to forming operation and all defects are provided from top electrode 102 during forming.

During the forming operation, ReRAM cell 100 changes its structure from the one shown in FIG. 1A to a structure shown in FIG. 1B or a structure shown in FIG. 1C. This change corresponds to defects 108 being arranged within resistive switching layer 104 into one or more continuous paths as, for example, schematically illustrated in FIGS. 1B and 1C. During this operation, some or all defects 108 forming the conductive paths may enter resistive switching layer 104 from top electrode 102 and/or bottom electrode 106. For simplicity, all these defect transfer and rearrangement are collectively referred to as reorientation of defects within ReRAM cell 100.

The reorientation of defects 108 occurs when a certain forming voltage is applied to electrodes 102 and 106. Depending on the polarity of the forming voltages, the current may flow either from top electrode 102 to bottom electrode 106 or vice versa, i.e., from bottom electrode 106 to top electrode 102. This flow of current impacts distribution of defects with resistive switching layer. Depending on types of defects, the defects may flow in the same direction as the current or in the opposite direction. Without being restricted to any particular theory, it is believed that defects' movement is driven by the field. After applying the voltage to the cell, the field is first uniformly distributed on the surface of the electrode. The defects are driven by the field from one electrode to another. However, once defects start reaching one of the electrodes the distribution of the field changes and now extends into the resistive switching layer. This situation is analogous to a portion of the electrode extending into the resistive switching layer. Furthermore, the field becomes localized in this point attracting more defects and effectively forming a conical shape of defects around this point. More defects become attracted to this point continuously extending into the resistive switching layer resulting in the growth of the filament. As such, the filament growth corresponds to continuous redistribution of the field. For brevity, the description is focused on the defects that flow in the direction of the current. However, one having ordinary skills in the art would understand that other types of defects (i.e., that flow in the direction opposite of the current direction) are also within the scope of this disclosure.

When the defects flow in the direction of the current and the forming current is directed from bottom electrode 106 to top electrode 102, the distribution of defects in a formed ReRAM cell (after completing the formation operation) may be similar to the one illustrated in FIG. 1B. In this example, the defects form a conductive path 109 extending through resistive switching layer 104 between top electrode 102 and bottom electrode 106 or, more specifically, between a top interface 103 formed by top electrode 102 and resistive switching layer 104 and a bottom interface 105 formed by bottom electrode 106 and resistive switching layer 104. Conductive path 109 has its wider base portion at top interface 103 and its narrow neck portion at bottom interface 105. When this ReRAM cell is switched into a high resistive state, the narrow neck portion of the conductive path is broken as, for example, shown in FIG. 1D by redistributing defects with resistive switching layer 104. A broken conductive path 129 still connects to top interface 103 but it is disconnected from bottom interface 105. As such, the ReRAM cell now has a higher resistance than in the state illustrated in FIG. 1B. For this cell, in order to switch from the low resistive state shown in FIG. 1B to the high resistive state shown in FIG. 1D, the switching current may be directed from bottom electrode 106 to top electrode 102 and this current carries the defects away from bottom interface 105. Switching from the high resistive state to the low resistive state is performed by flowing the electrical current from top electrode 102 to bottom electrode 106 carried the defects towards bottom interface 105. As noted above, the portion of the conductive path that is being broken and rebuilt is located within the switching zone of resistive switching layer, which is in this examples (FIGS. 1B and 1D) is located near or at bottom interface 105.

When the forming current is directed from top electrode 102 to bottom electrode 106 (during the forming operation), the distribution of defects in a formed ReRAM cell may be similar to the one illustrated in FIG. 1C. In this example, the defects also form a conductive path 119 extending through resistive switching layer 104 between top interface 103 and bottom interface 105. However, conductive path 109 has its wider base portion at bottom interface 105 and its narrow neck portion at top interface 103. When this ReRAM cell is switched into a high resistive state, the narrow neck portion of the conductive path is broken as, for example, show in FIG. 1E by redistributing defects with resistive switching layer 104. A broken conductive path 139 still connects to bottom interface 105 but it is disconnected from top interface 103. As such, the ReRAM cell now has a higher resistance than in the state illustrated in FIG. 1C. For this cell, in order to switch from the low resistive state shown in FIG. 1C to the high resistive state shown in FIG. 1E, the switching current may be directed from top electrode 102 to bottom electrode 106 and this current carries the defects away from top interface 103. Switching from the high resistive state to the low resistive state is performed by flowing the current from bottom electrode 106 to top electrode 101, and this current carried the defects towards top interface 103. As such, the switching zone in this example (FIGS. 1C and 1E) is located near or at bottom interface 105.

Forming and switching may be performed by applying certain voltages or, more specifically, certain voltage pulses to electrodes 102 and 106. The current resistive states and any resistive state changes are monitored by applying a gentle voltage pulse that does not have any substantial impact on distribution of defects within resistive switching layer 104. This pulse may be referred to as a reading pulse. In some embodiments, each forming and/or switching pulse may be followed by a reading pulse thereby achieving a closed loop control system. As such, forming and/or switching pulses may be applied and ramped up until a certain desired resistance of the ReRAM cell is achieved.

In some embodiments, the location of the switching zone with a ReRAM cell may be changed. This change is referred to a complementary switching, which should be distinguished from forming, during which initial conductive paths are formed and locations of the switching zones are determined, and from operational switching, during which conductive paths are broken and reestablished but the location of switching zone is not moved (at least substantially). In some embodiments, the complementary switching moves the switching zone from one electrode interface to another, i.e., effectively through the entire thickness of the resistive switching layer. The complementary switching may or/may not involve breaking and rebuilding the conductive path. However, the complementary switching involves reshaping the conductive path by, for example, moving its wide base portion from one electrode interface to the other electrode interface.

The complementary switching may be initiated when the cell is its low resistive state or when the cell its high resistive state and typically continues until the cell is a different high resistive state at which the conductive filament is broken within a new switching zone. As noted above, it is believed that the conductive filament is reshaped during the complementary switching as will now be described with reference to FIGS. 2A-2E. FIG. 2A illustrates a schematic representation of a ReRAM cell 200 in its high resistive state with a switching zone located near bottom electrode interface 205, in accordance with some embodiments. Specifically, ReRAM cell 200 includes a top electrode 202, a bottom electrode 206, and a resistive switching layer 204 disposed between top electrode 202 and bottom electrode 206. Top electrode 202 and resistive switching layer form top interface 203, while bottom electrode 206 and resistive switching layer 204 form bottom interface 205. In this low resistive state, a conductive filament 208 does not extend all the way to bottom interface 205. However, conductive filament 208 may have a defined taper with a wide base portion reaching top interface 203.

Figure 2B:
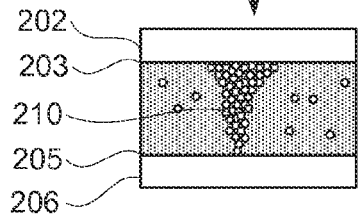
Figure 2C:
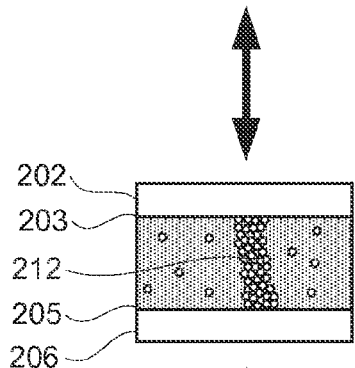

When the defects flow in the direction of the current and the current is directed from top electrode 101 to bottom electrode 102, the conductive filament may start extending by virtue of the defects flowing toward bottom electrode 106. At some points, conductive filament 210 reaches bottom interface 205 as shown in FIG. 2B. At this point, the cell is in a low resistive state and the flow of the current may be discontinued. The cell may be switched back to its high resistive state shown in FIG. 2A by reversing the current flow and flowing the current from bottom electrode 206 to top electrode 202. Toggling between the high resistive state shown in FIG. 2A and the low resistive state shown in FIG. 2B without changing the location of the switching zone (i.e., near bottom electrode for these operations) is referred to operational switching. These operations are the same as resistive switching described above with reference to FIGS. 1B and 1D. As noted above, one or both operational switching may be a part of the overall complementary switching. For example, the process may start with a high resistive state and finish with a high resistive state, thereby involving two operational switching, i.e., one in one switching zone and another in a different switching zone. In another example, the process may start with a low resistive state and finish with a high resistive state, thereby involving only one operational switching, i.e., the one in a new switching zone. In yet another example, the process may start with a high resistive state and finish with a low resistive state, thereby involving only one operational switching, i.e., the one in the original switching zone. Finally, operational switching may start with a low resistive state and finish with a low resistive state, thereby not involving any operational switching and simply reshaping the conductive filament without breaking it.

Figure 2D:
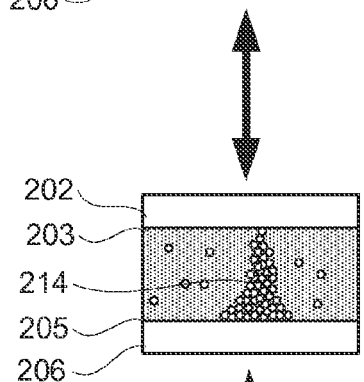
Figure 2E:
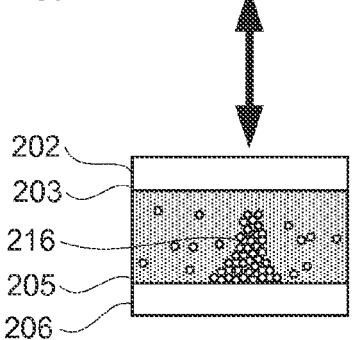
Figure 2F:
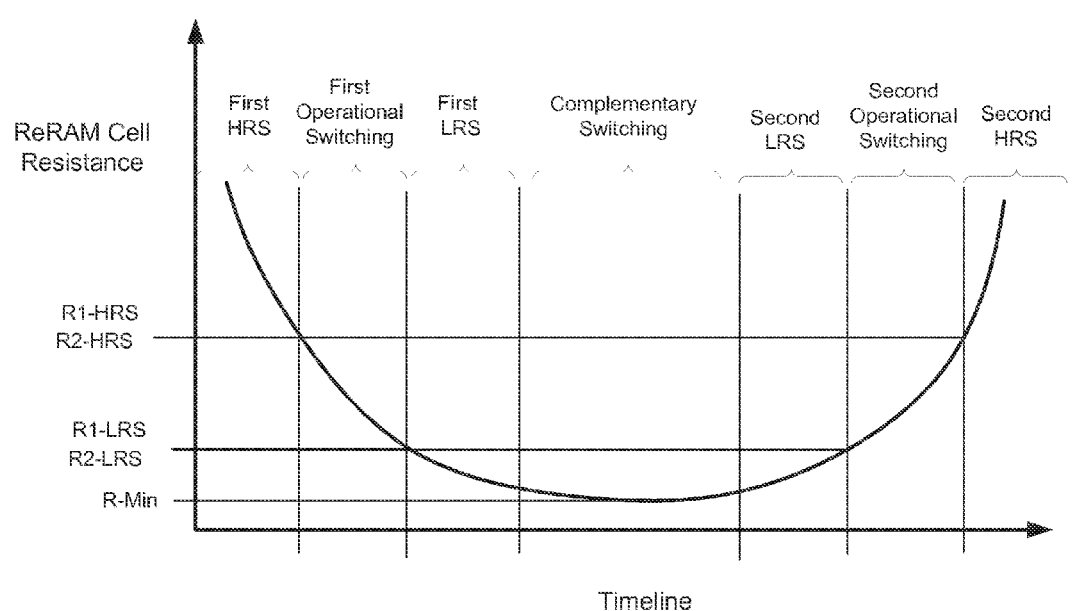
FIG. 2F illustrates a plot of the resistance of a ReRAM cell during its two types of operational switching and complementary switching, in accordance with some embodiments.

Changes in resistance of the cell as they go through operational switching and complementary switching are schematically shown in FIG. 2F, which is a plot of a cell resistance as a function of state. The X-axis is divided into first high resistive state (corresponding to FIG. 2A), first operational switching (corresponding to a transition between FIGS. 2A and 2B), first low resistive state (corresponding to FIG. 2B), complementary switching (corresponding to a transition between FIGS. 2B and 2D), second low resistive state (corresponding to FIG. 2D), second operational switching (corresponding to a transition between FIGS. 2D and 2E), and second high resistive state (corresponding to FIG. 2E). The threshold resistance value for the first high resistive state is shown as "R1-HRS," while the threshold resistance value for the first low resistive state is shown as "R1-LRS." In a similar manner, the threshold resistance value for the second high resistive state is shown as "R2-HRS," while the threshold resistance value for the second low resistive state is shown as "R2-LRS." In this example, R1-HRS is substantially the same as R2-HRS, while R1-LRS is substantially the same as R2-HRS. This situation may be referred to as a symmetrical cell, in which the conductive filaments operate in substantially the same way despite their orientation. In this situation, the difference between the two operating modes (i.e., operational switching between R1-HRS and R1-LRS and operational switching between R2-HRS and R2-LRS) may be identified based on the performance of the cell or based on the last forming or complimentary switching operation.

Various operations of the ReRAM cell will now be described with reference to FIG. 2F. When the cell is subjected to the first operational switching and has a resistance that is higher than R1-HRS, it is considered to be in its high resistive state, while when the cell has a resistance that is lower than R1-LRS, it is considered to be in its low resistive state. In these embodiments, the controller system may be made aware whether the cell is subjected to the first operational switching or the second operational switching. In some embodiments, a reading operation may be used to determine the type of operational switching if, for example, R1-HRS is distinguishable from R2-HRS and/or R1-LRS is distinguishable from R2-LRS. In other words, the reading operation may be used to determine the type of operational switching if R1-HRS, R2-HRS, R1-LRS, R2-LRS are clearly identifiable as further described below.

In order to proceed with complementary switching when the cell is in the state depicted in FIG. 2B, the current may continue to flow from top electrode 202 to bottom electrode 206 even though the cell is already in its low resistive state. As a result, the defects are continuing to move in the direction of the current. This may result in thinning of the base portion and thickening of the neck portion resulting in some kind of an intermediate conductive path 212 as, for example, shown in FIG. 2C. Intermediate conductive path 212 may not have a defined switching zone and complementary switching needs to be continued. The resistance of the cell may continue to decrease to a certain point as, for example, shown in FIG. 2F by the complementary transition zone. In some embodiments, the resistance value may pass through a certain minimum value, e.g., R-Min identified in FIG. 2F. This passage through a minimum resistance may be used as indication of complementary switching.

At some point, the current flow may move so many defects towards bottom electrode 206 that fewer defects are present at top interface 203 than at bottom interface 205 as, for example, shown in FIG. 2D. At this stage, conductive filament 214 may have a wide base at bottom interface 205 and narrow neck at top interface 203. As such, the switching zone is now near top interface 203. This stage may correspond to a low resistive state of the second operational switching.

While in some embodiments, the complementary switching may be completed at this point, it may be difficult to identify this stage based on resistance measurements as shown in FIG. 2F. Only until it is determined that the resistance continues to drop, by virtue of switching into a low resistive state of the second operational switching, can it be safely identified that the complementary switching is in fact completed and a new switching zone is established with the resistive switching layer. In other words, the operational switching may be used as a safety check that the complementary switching is in fact completed. As such, the cell may be brought to the state shown in FIG. 2E as a part of the overall complementary switching and the last operational switching is a part of the complementary switching. At this point, the cell can be subjected to the second operational switching between its low resistive state (FIG. 2D) and high resistive state (FIG. 2E). However, the switching zone is now near top interface.

As noted above, in some embodiments, second operational switching thresholds (i.e., "R2-HRS" and "R2-LRS") may be different from first operational switching thresholds (i.e., "R1-HRS" and "R1-LRS"). Two such examples are presented in FIG. 3A and FIG. 3B. Specifically, in these examples, R1-HRS is greater than R2-HRS, while R1-LRS is greater than R2-LRS. Furthermore, in both examples, R1-LRS is greater than R2-HRS. However, this last relationship may be optional. Since all thresholds are clearly distinguishable in these examples (i.e., R1-HRS>R1-LRS>R2-HRS>R2-LRS), the current resistance (e.g., identified during a reading operation) may be used as an indicator of the operating regime as well as the resistive state.

Figure 3A:
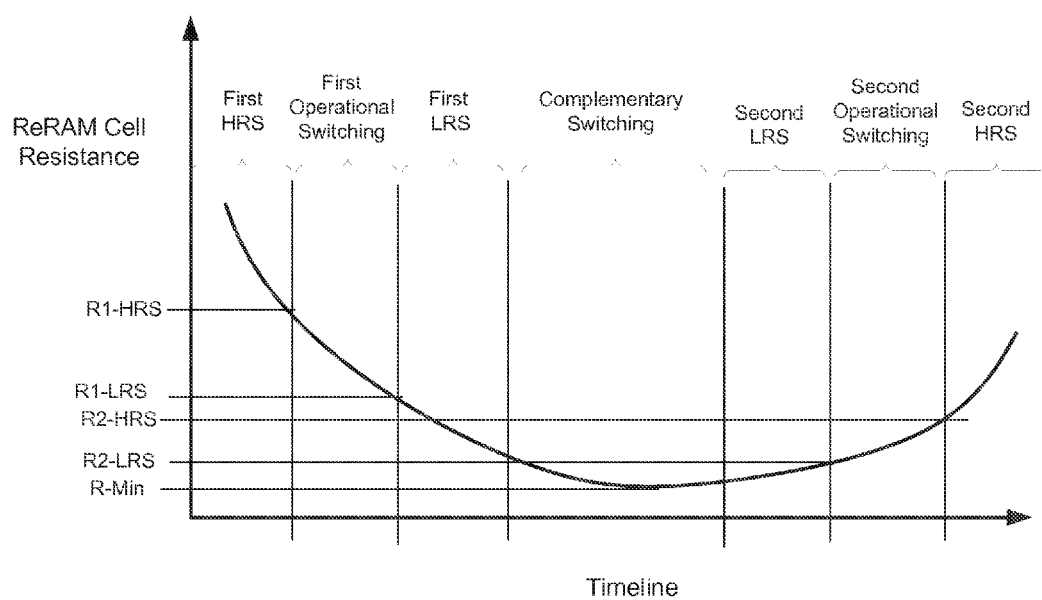
FIGS. 3A and 3B illustrate two additional plots of the resistance of ReRAM cells during their operational switching and complementary switching, in accordance with some embodiments.
Figure 3B:
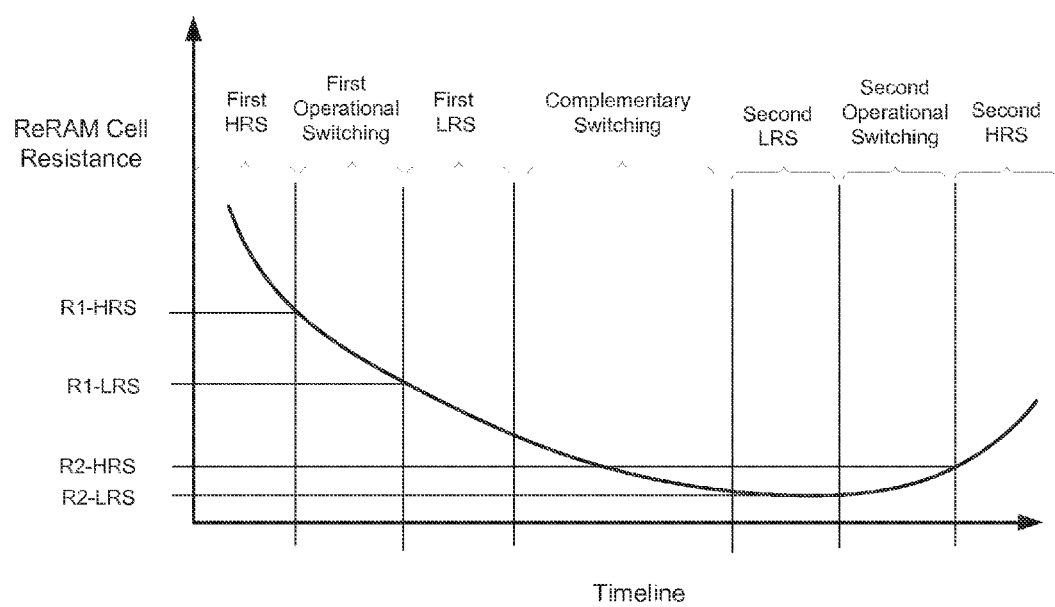

The difference between the example shown in FIG. 3A and FIG. 3B, is that the plot shown in FIG. 3A has a clearly identifiable minimum of the resistance (i.e., "R-Min") that falls within the complementary switching region. This R-Min may be used to identify the complementary switching and distinguish it from the operational switching. The resistance minimum of the plot shown in FIG. 3B falls within the second low resistance state.

Figure 4:
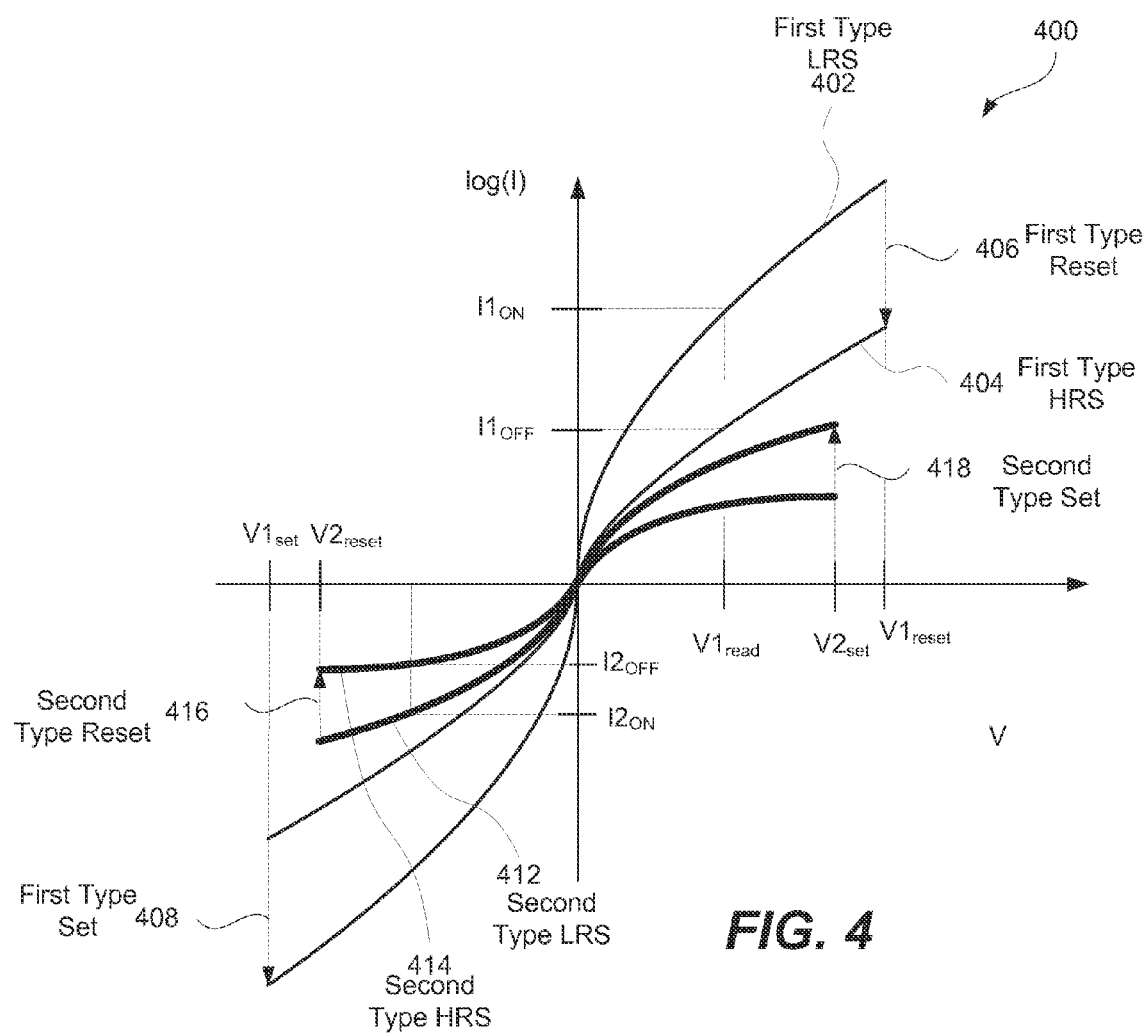
FIG. 4 illustrates a plot of a current passing through a ReRAM cell as a function of a voltage applied to the ReRAM cell, in accordance with some embodiments.

FIG. 4 illustrates a plot 400 of a current passing through a ReRAM cell as a function of a voltage applied to the ReRAM cell, in accordance with some embodiments. As noted above, a cell may be formed to switch at one interface or another interface. Both switching alternatives are presented in the same graph, i.e., a first type of operational switching and a second type of operational switching. The first operational switching has a corresponding first low resistive state 402 and a first high resistive state 404 shown by thinner lines in FIG. 4. The second operational switching has a corresponding second low resistive state 412 and a second high resistive state 414 shown by thicker lines in FIG. 4. Each of these states may be used to represent a different logic state, e.g., first low resistive state 402 may represent logic one ("1"), while first high resistive state 404 representing logic zero ("0") or vice versa and, separately, second low resistive state 412 may represent logic one ("1"), while second high resistive state 414 representing logic zero ("0") or vice versa. However, these two sets of high and low resistive states may be used independently as different memory types. Specifically, plot 400 shows that the second type of operational switching requires lower power. It may also have other characteristics that may be more suitable, for example, for fast and low-retention types of memory. On the other hand, the first type switching may have better retention characteristics.

The operation of the cell will now be described with reference to the first operational switching type. The overall operations of the ReRAM cell may be divided into a read operation, a set operation (i.e., turning the cell "ON" by changing from its high resistive state to low resistive state), and a reset operation (i.e., turning the cell "OFF" by changing from its low resistive state to high resistive state). During the read operation, the state of the ReRAM cell or, more specifically, the resistive state of its resistive switching layer can be sensed by applying a sensing voltage to its electrodes. The sensing voltage is sometimes referred to as a "READ" voltage or simply a read voltage and indicated as $V1_{READ}$ in FIG. 4. If the ReRAM cell is in its high resistive state 404, the external read and write circuitry connected to the electrodes will sense the resulting "OFF" current ($I1_{OFF}$) that flows through the ReRAM cell. As stated above, this read operation may be performed multiple times without changing the resistive state (i.e., switching the cell between its high resistive state and low resistive state). In the above example, the ReRAM cell should continue to output the "OFF" current ($I1_{OFF}$) when the read voltage ($V1_{READ}$) is applied to the electrodes for the second time, third time, and so on.

Continuing with the above example, when it is desired to turn "ON" the cell that is currently in the high resistive state switch, a set operation is performed. In some embodiments, this operation may use the same read and write circuitry to apply a set voltage ($V1_{SET}$) to the electrodes. Applying the set voltage forms one or more conductive paths in the resistive switching layer as described above. The switching from the first high resistive state to the first low resistive state is indicated by dashed line 408 in FIG. 4. The resistance characteristics of the ReRAM cell in its first low resistive state are represented by line 402. When the read voltage ($V1_{READ}$) is applied to the electrodes of the cell in this state, the external read and write circuitry will sense the resulting "ON" current ($I1_{ON}$) that flows through the ReRAM cell. Again, this read operation may be performed multiple times without switching the state of the ReRAM cell.

At some point, it may be desirable to turn "OFF" the ReRAM cell by changing its state from the first low resistive state to first high resistive state. This operation is referred to as a reset operation and should be distinguished from set operation during which the ReRAM cell is switched from its first high resistive state to its first low resistive state. During the reset operation, a reset voltage ($V1_{RESET}$) is applied to the ReRAM cell to break the previously formed conductive paths in the resistive switching layer. Switching from the first low resistive state to the first high resistive state is indicated by dashed line 406. Detecting the state of the ReRAM cell while it is in its first high resistive state is described above.

Overall, the ReRAM cell may be switched back and forth between its first low resistive state and its first high resistive state many times. Read operations may be performed in each of these states (between the switching operations) one or more times or not performed at all. It should be noted that applying set and reset voltages to change the first resistive state of the ReRAM cell involves complex mechanisms that are believed to involve localized resistive heating as well as mobility of defects impacted by both temperature and applied potential.

The second type of operational switching is performed in a similar manner. However, the polarity of the set voltage ($V2_{SET}$) during this operational switching is reversed in comparison to the first type of operational switching resulting in the opposite directions of the current flow during switching. The set operation of the second type is shown with a dashed line 418 in FIG. 4. Likewise, the polarity of the reset voltage ($V2_{RESET}$) is reversed in comparison to the first type operational switching resulting in the opposite directions of the current flow during switching. The reset operation of the second type switching is shown with a dashed line 416 in FIG. 4. The polarity of the read voltage during the second type switching may be the same or different as the polarity of the read voltage during the first type switching.

Examples of Forming and Switching ReRAM Cells

Figure 5:
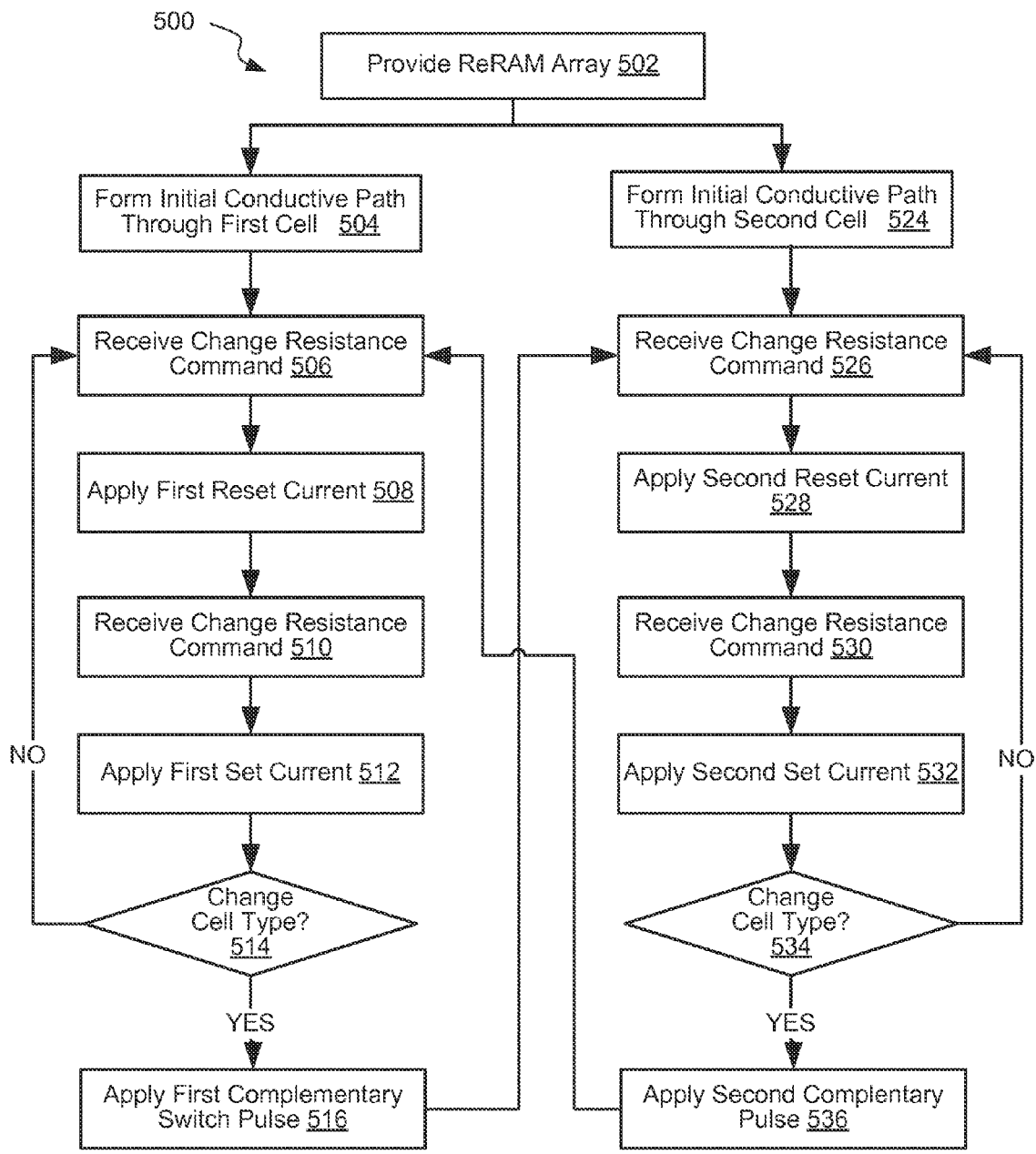
FIG. 5 illustrates a process flowchart corresponding to a method of forming a ReRAM cell and operating the cell, in accordance with some embodiments.

FIG. 5 is a flowchart corresponding to a method 500 of forming, operational switching, and complementary switching of array containing the same type of ReRAM cells, in accordance with some embodiments. Method 500 may commence with providing a ReRAM array including at least two ReRAM cells, i.e., a first ReRAM cell and a second ReRAM cell, during operation 502. Each ReRAM cell includes a top electrode, a bottom electrode, and a resistive switching layer disposed between the top electrode and the bottom electrode. Specifically, the first ReRAM cell includes a first top electrode, a first bottom electrode, and a first resistive switching layer, while the second ReRAM cell includes a second top electrode, a second bottom electrode, and a second resistive switching layer. The top electrodes of both ReRAM cells have the same composition and, in some embodiments, the same thickness. The bottom electrodes of both ReRAM cells have the same composition and, in some embodiments, the same thickness. Furthermore, the resistive switching layers of both ReRAM cells have the same composition and, in some embodiments, the same thickness. In some embodiments, the top electrodes have different compositions than the bottom electrodes, i.e., the first top electrode has a different composition than the first bottom electrode and the second top electrode has a different composition than the second bottom electrode.

In some embodiments, both top electrodes may be parts of the same initial layer deposited onto the substrate during fabrication of the array. Furthermore, both bottom electrodes may be parts of the same initial layer. In some embodiments, either both top electrodes or both bottom electrodes may be parts of the same signal line of the array. Furthermore, both resistive switching layers may be parts of the same initial layer. Various examples of ReRAM cells and memory arrays are described below with reference to FIGS. 6A-6B and FIGS. 7A-7B. The two cells provided during operation 502 do not have any conductive paths or have been subjected to forming operations.

Method 500 may proceed with forming an initial conductive path through the resistive switching layer of the first ReRAM cell during operation 504. During this operation, the electrical current is passed in a direction from the top electrode to the bottom electrode of the first ReRAM cell. The operation may involve one or more voltage pulses applied to these electrodes until reaching a predetermined resistance threshold. The polarity of these pulses is selected in such a way that the electrical current is passed in a direction from the first top electrode to the first bottom electrode.

Method 500 may proceed with forming an initial conductive path through the resistive switching layer of the second ReRAM cell during operation 524. This operation involves passing a current in a direction from the bottom electrode to the top electrode of the second ReRAM cell, which may be driven by one or more voltage pulses applied to these electrodes. The pulses may be ramped up and applied until reaching a predetermined resistance threshold. The resistance may be monitored by applying a reading pulse after each forming pulse. The polarity of these pulses is selected in such a way that the electrical current is passed in a direction from the bottom electrode to the top electrode. As a result, the first cell is formed in a different manner than the second cell, even though the cells are parts of the same array.

The difference in these formation operations may yield cells having different switching characteristics. Some of these characteristics may be evident right after completing the formation operations and before performing any subsequent operational switching. In this state, the resistive switching layers have the initially formed conductive paths that may be later modified by operational switching. For example, the resistance of the first resistive switching layer having its initially formed conductive path may be different than that of the second resistive switching layer having its initially formed conductive paths. While the structures of both cells prior to forming operations 504 and 524 were substantially the same, the structures have changed in a different manner. More specifically, the initial formed conductive path with the first resistive switching layer is different from the initial formed conductive path within the second resistive switching layer. These conductive paths may be evident from the difference in the resistive switching layers' resistances or, more generally, from the difference in the ReRAM cells' resistances. In some embodiments, the resistance of the first resistive switching layer at this state is less than a half of the resistance of the second resistive switching layer.

It should be noted that operation 524 may be performed before operation 504. Furthermore, a formed cell may be subjected to reading and switching operations (including complimentary switching) before the other cell is formed. For example, method 500 may proceed with receiving a command to change the resistance of the first cell to its high resistive state during operation 506 and proceed with applying a first reset current through the first resistive switching layer during operation 508. The first reset current is passed in a direction from the bottom electrode to the top electrode of the first ReRAM cell and breaks the initially formed conductive path in the first resistive switching layer of the first ReRAM cell. The same operations 506 and 508 may be used to break a conductive path formed during subsequent switching operations or, more generally, when the first ReRAM cell is in its low resistive state.

Method 500 may also involve receiving a command to change the resistance of the second ReRAM cell to its high resistive state during operation 526 and proceed with applying a second reset current through the second resistive switching layer during operation 528. The second rest current is passed in a direction from the top electrode to the bottom electrode of the second ReRAM cell and breaks the initially formed conductive path in the second resistive switching layer. The same operations 526 and 528 may be used to break a conductive path formed during subsequent switching operations or, more generally, when the second ReRAM cell is in its low resistive state.

In some embodiments, the total power used for breaking the initially formed conductive path through the first resistive switching layer is different than the total power used for breaking the initially formed conductive path through the second resistive switching layer. For example, the total power used for breaking the initially formed conductive path within the first resistive switching layer is less than a half of the total power used for breaking the initially formed conductive path within the second resistive switching layer.

Method 500 may proceed with receiving a command to change the resistance of the first ReRAM cell to its low resistive state during operation 510 and proceed with applying a first set current through the first resistive switching layer during operation 512. During this operation a new conductive path is set within the first resistive switching layer by passing an electrical current in a direction from the top electrode to the bottom electrode of the first ReRAM cell. The new conductive path may be substantially the same as the initially formed conductive path in a way that the location of the switching zone does not change.

Likewise, method 500 may proceed with receiving a command to change the resistance of the second ReRAM cell to its low resistive state during operation 530 and proceed with applying a second set current through the second resistive switching layer during operation 532. During this operation a new conductive path is set within the second resistive switching layer by passing an electrical current in a direction from the bottom electrode to the top electrode of the second ReRAM cell. The new conductive path may be substantially the same as the initially formed conductive path in a way that the location of the switching zone remains near the same electrode. However, the locations of the switching zones in the first ReRAM cell and in the second ReRAM cell are different until complementary switching is performed on one of these cells.

In some embodiments, the total power used for setting the new conductive path through the first resistive switching layer may be different from the total power used for setting the new conductive path through the second resistive switching layer. For example, the total power applied to the first ReRAM cell may be less than a half of the total power applied to the second ReRAM cell. In some embodiments, the resistance of the first resistive switching layer having the initial conductive path is the same as the resistance of the first resistive switching layer having the new conductive path. This resistance similarity may be a result of the similar resistance thresholds used for the forming operation and set operation.

In some embodiments, method 500 may proceed with changing the switching type of the first ReRAM cell, i.e., performing complementary switching as reflected by decision block 514 and operation 516. In a similar manner, method 500 may proceed with changing the switching type of the second ReRAM cell, i.e., performing complementary switching as reflected by decision block 534 and operation 536. During operations 516 or during 536, the location of the switching zone is moved from one side of the resistive switching layer to another. This movement of the switching zone is described above with reference to FIGS. 2A-2E. Specifically, operations 516 may involve forming a modified conductive path through the resistive switching layer of the first ReRAM cell by passing an electrical current in the direction from the bottom electrode to the top electrode of this cell.

After complementary switching, the directions of the set and reset currents used for operational switching (i.e., to form and break new kinds of conductive paths) are reversed. For example, the modified conductive path formed with the first resistive switching during the complementary switching may be broken by passing an electrical current in a direction from the top electrode to the bottom electrode of the first ReRAM cell. Thereafter, a new modified conductive path may be set through first the resistive switching layer of the first ReRAM cell by passing an electrical current in a direction from the bottom electrode to the top electrode of the first ReRAM cell. In this example, after complementary switching, the first ReRAM cell may be operable similar to the second ReRAM cell after initial formation (and before any resistive switching). The second ReRAM cell may be subject to the complementary switching in a similar manner. In some embodiments, a ReRAM cell may be subjected to multiple complementary switchings.

Examples of ReRAM Cells

Figure 6:
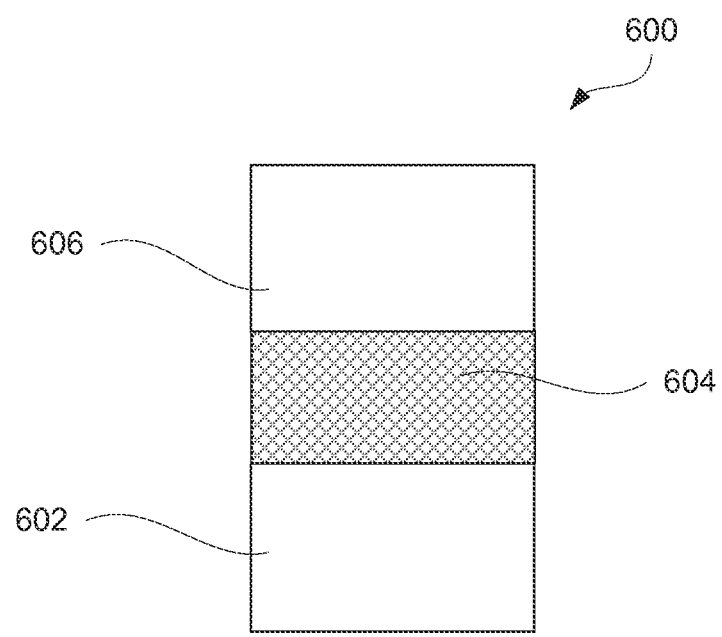
FIG. 6 illustrates a schematic representation of a ReRAM cell, in accordance with some embodiments.

FIG. 6 illustrates a schematic representation of a ReRAM cell 600, in accordance with some embodiments. ReRAM cell 600 may include first electrode layer 602, resistive switching layer 604, and second electrode layer 606. The "first" and "second" terminology is used herein only for differentiating reasons and does not imply any deposition order or spatial orientation of the layers unless specifically noted.

First electrode layer 602 and second electrode layer 606 provide electrical connections to ReRAM cell 600. In some embodiments, first electrode layer 602 and/or second electrode layer 606 are parts of signal lines that extend between multiple ReRAM cells, which may be cells provided in the same row or column a memory array as further described below with reference to FIGS. 7A and 7B. In some embodiments, first electrode layer 602 and/or second electrode layer 606 may be separate components from the signal lines. For example, first electrode layer 602 or second electrode layer 606 may be an intermediate electrode and additional components, such as a diode may be provided between this electrode and a signal line.

First electrode layer 602 and second electrode layer 606 are typically made from conductive materials. Some examples of suitable electrode materials include n-doped polysilicon, titanium nitride, ruthenium, iridium, platinum, and tantalum nitride. In some embodiments, the material of first electrode layer 602 is different from material of second electrode layer 606. For example, one electrode may be made from n-doped polysilicon, while the other electrode may be formed from titanium nitride. As a result, resistive switching layer 604 forms different kinds of interfaces resulting in different performance of first type of operational switching and second type of operational switching. In some embodiments, resistive switching layer 604 may also have different composition at its two interfaces with the electrode. For example, resistive switching layer 604 may include two or more sub-layers having different composition, such that one sub-layer interfaces one electrode and another sub-layer interfaces with another electrode.

First electrode layer 602 and/or second electrode layer 606 may have a thickness of less than about 1,000 Angstroms, such as less than about 500 Angstroms and even less than about 100 Angstroms. Thinner electrodes may be formed using ALD techniques.

Resistive switching layer 604 may be formed from one or more of the following materials: carbon polymers, perovskites, metal oxides and metal nitrides. Some examples of suitable metal oxides include nickel oxide, niobium oxide, titanium oxide, hafnium oxide, aluminum oxide, tantalum oxide, zirconium oxide, yttrium oxide, scandium oxide, magnesium oxide, chromium oxide, and vanadium oxide. Examples of nitrides include boron nitride and aluminum nitride. In some embodiments, metal oxides with a bandgap greater than 3 eV may be used. Some of examples such oxides include hafnium oxide, aluminum oxide, tantalum oxide, zirconium oxide, and yttrium oxide. In certain embodiments, the thickness of resistive switching layer 304 is between about 10 Angstroms and 500 Angstroms or, more specifically, between about 50 Angstroms and 200 Angstroms.

Memory Array Examples

Figure 7A:
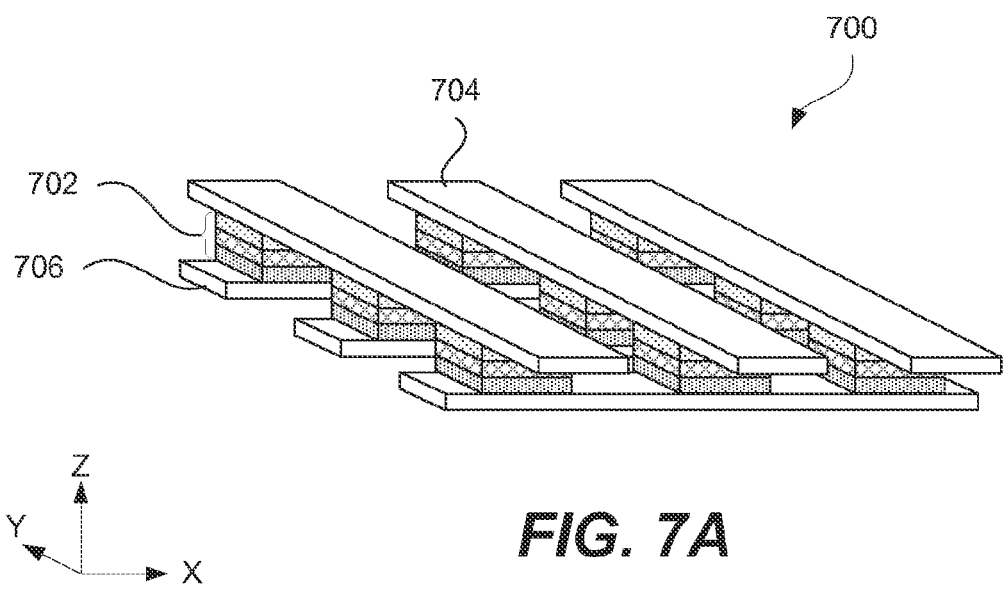
FIGS. 7A and 7B illustrate schematic views of memory arrays including multiple ReRAM cells, in accordance with some embodiments.

A brief description of memory arrays will now be described with reference to FIGS. 7A and 7B to provide better understanding to various forming and switching features described above. FIG. 7A illustrates a memory array 700 including nine ReRAM cells 702, in accordance with some embodiments. In general, any number of ReRAM cells may be arranged into one array. Connections to each ReRAM cell 702 are provided by signal lines 704 and 706, which may be arranged orthogonally to each other. This type of arrangement may be referred to as a cross-bar array. ReRAM cells 702 are positioned at crossings of signal lines 704 and 706 that typically define boundaries of each ReRAM cell in array 700. Some of these cells may be formed by passing an electrical current from one of top signal lines 704 to one of bottom signal lines 706, while other cells may be formed by passing an electrical current from one of bottom signal lines 706 to one of top signal lines 704. As noted above, this difference in forming operations results in different switching characteristics of the cells that are parts of the same array. The controller system (not shown) may be used to keep a track of different switching characteristics of the cells. Alternatively, this difference in switching characteristics may be identified by applying reading pulses to cells.

Signal lines 704 and 706 are sometimes referred to as word lines and bit lines. These lines are used to read and write data into each ReRAM cell 702 of array 700 by individually connecting ReRAM cells to read and write controllers. Individual ReRAM cells 702 or groups of ReRAM cells 702 can be addressed by using appropriate sets of signal lines 704 and 706. Each ReRAM cell 702 typically includes one or more layers disposed between the signal lines, such as a resistive switching layer, an embedded resistor, an embedded current steering element, and the like, some of which are further described elsewhere in this document. In some embodiments, a ReRAM cell has one or more electrodes that are separate components from the signal lines. For example, the one or more electrodes may be used to form a particular interface with the resistive switching layer, yet these electrodes may be insufficiently conductive to act as signal lines. In some embodiments, a ReRAM cell includes multiple resistive switching layers provided in between a crossing pair of signal lines 704 and 706.

As stated above, various read and write controllers may be used to control operations of ReRAM cells 702. A suitable controller is connected to ReRAM cells 702 by signal lines 704 and 706 and may be a part of the same memory device and circuitry. In some embodiments, a read and write controller is a separate memory device capable of controlling multiple memory devices each one containing an array of ReRAM cells. Any suitable read and write controller and array layout scheme may be used to construct a memory device from multiple ReRAM cells. In some embodiments, other electrical components may be associated with the overall array 700 or each ReRAM cell 702. For example, to avoid the parasitic-path-problem, i.e., signal bypasses by ReRAM cells in their low resistive state, serial elements with a particular non-linearity must be added at each node or, more specifically, into each element. Depending on the switching scheme of the ReRAM cell, these elements can be diodes or varistor-type elements with a specific degree of non-linearity. In the same other embodiments, an array is organized as an active matrix, in which a transistor is positioned at each node or, more specifically, embedded into each cell to decouple the cell if it is not addressed. This approach significantly reduces crosstalk in the matrix of the memory device.

Figure 7B:
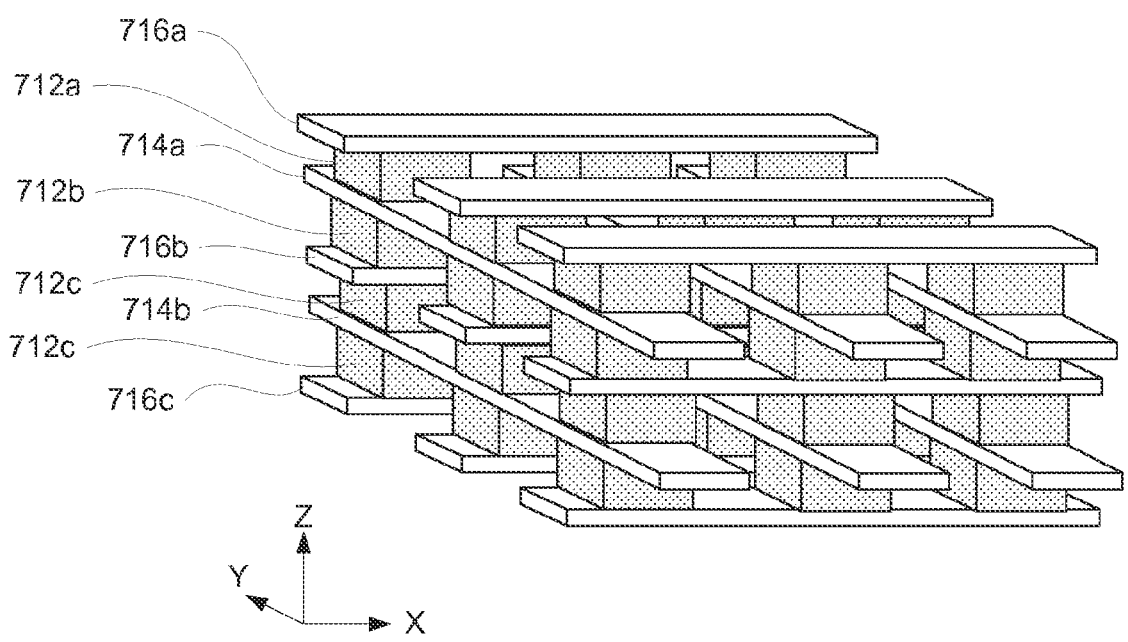

In some embodiments, a memory device may include multiple layers as, for example, illustrated in FIG. 7B. In this example, five sets of signal lines 714a-b and 716a-c are shared by four ReRAM layers 712a-c. As with the previous example, each ReRAM layer is supported by a pair of signal lines, e.g., layer 712a is supported by 714a and 716a. Middle signal lines 714a-b and 716b, each is shared by two sets ReRAM layers. For example, signal line set 714a provides connections to layers 712a and 712b. Top and bottom sets of signal lines 716a and 716c are only used for making electrical connections to one array. This 3-D arrangement of the memory device should be distinguished from various 3-D arrangements in each individual ReRAM cell. Different types of forming operations may be applied to cells within the same layer or different layer of such a memory device. However, it should be noted that spatial orientation of interfaces may vary from one layer to another. For example, if a signal line 714a directly interfaces resistive switching layers of layer 712a and 712b, then this type of interface may appear as a bottom interface of layer 712a and a top interface of layer 712b. One having ordinary skills in the art would understand the spatial symmetries of such 3-D arrangements.

CONCLUSION

Although the foregoing examples have been described in some detail for purposes of clarity of understanding, the invention is not limited to the details provided. There are many alternative ways of implementing the invention. The disclosed examples are illustrative and not restrictive.

What is claimed:

1. A method comprising:
providing a first resistive random access memory (ReRAM) cell,
the first ReRAM cell comprising a top electrode, a bottom electrode, and a resistive switching layer disposed between the top electrode and the bottom electrode,
the top electrode having a different composition than the bottom electrode;
setting an initial conductive path through the resistive switching layer of the first ReRAM cell,
wherein the forming the initial conductive path comprises
passing an electrical current in a direction from the top electrode to the bottom electrode of the first ReRAM cell,
wherein a resistance of the resistive switching layer decreases while the electrical current is passed in the direction from the top electrode to the bottom electrode of the first ReRAM cell and the initial conductive path is set through the resistive switching layer;
breaking the initial conductive path within the resistive switching layer of the first ReRAM cell,
wherein the breaking comprises passing an electrical current in a direction from the bottom electrode to the top electrode of the first ReRAM cell,
wherein the resistance of the resistive switching layer increases while the electrical current is passed in the direction from the bottom electrode to the top electrode of the first ReRAM cell and the initial conductive path is broken within the resistive switching layer; and
setting a new conductive path through the resistive switching layer of the first ReRAM cell,
wherein setting the new conductive path comprises passing an electrical current in a direction from the bottom electrode to the top electrode of the first ReRAM cell,
wherein the resistance of the resistive switching layer decreases while the electrical current is passed in the direction from the bottom electrode to the top electrode of the first ReRAM cell and the new conductive path is set through the resistive switching layer.

2. The method of claim 1, wherein the resistance of the resistive switching layer having the initial conductive path of the first ReRAM cell is different from the resistance of the resistive switching layer having the new conductive path.

3. The method of claim 2, wherein the resistance of the resistive switching layer having the initial conductive path of the first ReRAM cell is less than a half of the resistance of the resistive switching layer having the new conductive path.

4. The method of claim 1, further comprising:
breaking the new conductive path through the resistive switching layer of the first ReRAM cell,
wherein the breaking comprises passing an electrical current in a direction from the top electrode to the bottom electrode of the first ReRAM cell, and
wherein the resistance of the resistive switching layer increases while the electrical current is passed in the direction from the top electrode to the bottom electrode of the first ReRAM cell and the new conductive path is broken within the resistive switching layer.

5. The method of claim 4, wherein a total power used for breaking the initial conductive path through the resistive switching layer of the first ReRAM cell is different from a total power used for breaking the new conductive path through the resistive switching layer of the first ReRAM cell.

6. The method of claim 5, wherein the total power used for breaking the initial conductive path through the resistive switching layer of the first ReRAM cell is less than a half of the total power used for breaking the new conductive path through the resistive switching layer of the first ReRAM cell.

7. The method of claim 1, wherein a total power used for setting the new conductive path through the resistive switching layer of the first ReRAM cell is different from a total power used for setting the initial conductive path through the resistive switching layer of the first ReRAM cell.

8. The method of claim 7, wherein the total power used for setting the new conductive path through the resistive switching layer of the first ReRAM cell is less than a half of the total power used for setting the initial conductive path through the resistive switching layer of the first ReRAM cell.

9. The method of claim 1, wherein the top electrode of the first ReRAM cell comprises titanium nitride and wherein the bottom electrode of the first ReRAM cell comprises doped polysilicon.

10. The method of claim 9, wherein the bottom electrode of the first ReRAM cell comprises n-doped polysilicon.

11. The method of claim 1, wherein the resistive switching layer of the first ReRAM cell comprises hafnium oxide.

12. The method of claim 1, wherein the resistive switching layer of the first ReRAM cell has a first composition at its interface with the top electrode and a second composition at its interface with the second electrode, and wherein the first composition is different from the second composition.

13. The method of claim 1, wherein the resistive switching layer of the first ReRAM cell is a bi-layer.

14. The method of claim 13, wherein the bi-layer comprises two sub-layers having different compositions.

* * * * *